US012622108B2

(12) United States Patent
Check et al.

(10) Patent No.: US 12,622,108 B2
(45) Date of Patent: May 5, 2026

(54) INTERCONNECT STRUCTURES FOR IMPROVED LIGHT-EMITTING DIODE CHIP PERFORMANCE

(71) Applicant: CreeLED, Inc., Durham, NC (US)

(72) Inventors: Michael Check, Holly Springs, NC (US); Justin White, Morrisville, NC (US); Steven Wuester, Wake Forest, NC (US); Kevin Haberern, Cary, NC (US); Colin Blakely, Raleigh, NC (US); Jesse Reiherzer, Raleigh, NC (US)

(73) Assignee: CreeLED, Inc., Durham, NC (US)

( * ) Notice: Subject to any disclaimer, the term of this patent is extended or adjusted under 35 U.S.C. 154(b) by 402 days.

(21) Appl. No.: 18/302,106

(22) Filed: Apr. 18, 2023

(65) Prior Publication Data

US 2023/0395756 A1     Dec. 7, 2023

Related U.S. Application Data

(60) Provisional application No. 63/365,638, filed on Jun. 1, 2022.

(51) Int. Cl.
*H10H 20/831*      (2025.01)
*H10H 20/825*      (2025.01)
*H10H 20/841*      (2025.01)

(52) U.S. Cl.
CPC ...... *H10H 20/8316* (2025.01); *H10H 20/841* (2025.01); *H10H 20/8252* (2025.01)

(58) Field of Classification Search
CPC ............. H10H 20/8316; H10H 20/841; H10H 20/8252; H10H 20/835; H10H 20/8312
See application file for complete search history.

(56) References Cited

U.S. PATENT DOCUMENTS 8,390,009 B2 *   3/2013   Wang ..................... H01L 24/17
                                                        438/22
10,879,441 B2   12/2020   Check
                (Continued)

FOREIGN PATENT DOCUMENTS

JP         2019195050 A     11/2019
TW          201535784 A      9/2015
                (Continued)

OTHER PUBLICATIONS

Examination Report for Taiwanese Patent Application No. 112119475, mailed Jan. 18, 2024, 24 pages.
                (Continued)

*Primary Examiner* — Mamadou L Diallo
(74) *Attorney, Agent, or Firm* — Withrow & Terranova, P.L.L.C.

(57)                    ABSTRACT

Solid-state lighting devices including light-emitting diode (LED) chips and more particularly interconnect structures for improved LED chip performance are disclosed. Interconnect structures are disclosed within LED chips that are structured to increase perimeter contact areas within localized LED chip areas without substantial increases to overall areas occupied by the interconnect structures. By increasing contact perimeters of interconnects within a certain area, increased current injection efficiency may be provided. Interconnect structures for increased current injection are disclosed for both n-type layers and p-type layers. Interconnect structures may include patterned dielectric materials within interconnect openings and corresponding interconnects that are formed around the patterned dielectric materials. Additional interconnect structures include nested patterns and extensions that provide enhanced adhesion along LED chip perimeters.

26 Claims, 11 Drawing Sheets

(56)        References Cited

U.S. PATENT DOCUMENTS

| 2015/0263236 A1 | 9/2015 | Suzuki |
| 2019/0115511 A1 | 4/2019 | Lin et al. |
| 2020/0303591 A1 | 9/2020 | White |
| 2022/0384516 A1* | 12/2022 | Tan ......................... H01L 25/18 |
| 2023/0154968 A1* | 5/2023 | Lopez ................. H10H 29/142 |
| | | 257/76 |

FOREIGN PATENT DOCUMENTS

| TW | 201817049 A | 5/2018 |
| TW | I672837 B | 9/2019 |
| TW | 202209705 A | 3/2022 |
| WO | 2009010762 A1 | 1/2009 |

OTHER PUBLICATIONS

Examination Report for Taiwanese Patent Application No. 113130030, mailed Oct. 18, 2024, 16 pages.

International Search Report and Written Opinion for International Patent Application No. PCT/US2023/023861, mailed Sep. 28, 2023, 17 pages.

Notice of Allowance for Taiwanese Patent Application No. 112119475, mailed May 13, 2024, 3 pages.

\* cited by examiner

INTERCONNECT STRUCTURES FOR IMPROVED LIGHT-EMITTING DIODE CHIP PERFORMANCE

RELATED APPLICATIONS

This application claims the benefit of provisional patent application Ser. No. 63/365,638, filed Jun. 1, 2022, the disclosure of which is hereby incorporated herein by reference in its entirety.

FIELD OF THE DISCLOSURE

The present disclosure relates to solid-state lighting devices including light-emitting diodes (LEDs) and more particularly to interconnect structures for improved LED chip performance.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An active region may be fabricated, for example, from silicon carbide, gallium nitride, gallium phosphide, aluminum nitride, and/or gallium arsenide-based materials and/or from organic semiconductor materials. Photons generated by the active region are initiated in all directions.

Typically, it is desirable to operate LEDs at the highest light emission efficiency, which can be measured by the emission intensity in relation to the output power (e.g., in lumens per watt). A practical goal to enhance emission efficiency is to maximize extraction of light emitted by the active region in the direction of the desired transmission of light. Light extraction and external quantum efficiency of an LED can be limited by a number of factors, including internal reflection. If photons are internally reflected in a repeated manner, then such photons will eventually be absorbed and never provide visible light that exits an LED. To increase the opportunity for photons to exit an LED, it has been found useful to pattern, roughen, or otherwise texture the interface between an LED surface and the surrounding environment to provide a varying surface that increases the probability of refraction over internal reflection and thus enhances light extraction. Reflective surfaces may also be provided to reflect generated light so that such light may contribute to useful emission from an LED chip. LEDs have been developed with internal reflective surfaces or layers to reflect generated light.

The quantum efficiency of an LED can also be limited by other factors, such as how well current is able to spread within an LED. To increase current spreading for LEDs, and in particular for larger area LEDs, it has been found useful to add layers of high electrical conductivity over one or more epitaxial layers of an LED. Additionally, electrodes for the LEDs can have larger surface area and may include various electrode extensions or fingers that are configured to route and more evenly distribute current across an LED.

As advancements in modern LED technology progress, the art continues to seek improved LEDs and solid-state lighting devices having desirable illumination characteristics capable of overcoming challenges associated with conventional lighting devices.

SUMMARY

The present disclosure relates to solid-state lighting devices including light-emitting diodes (LEDs) and more particularly to interconnect structures for improved LED chip performance. Interconnect structures are disclosed within LED chips that are structured to increase perimeter contact areas within localized LED chip areas without substantial increases to overall areas occupied by the interconnect structures. By increasing contact perimeters of interconnects within a certain area, increased current injection efficiency may be provided.

Interconnect structures for increased current injection are disclosed for both n-type layers and p-type layers. Interconnect structures may include patterned dielectric materials within interconnect openings and corresponding interconnects that are formed around the patterned dielectric materials. Additional interconnect structures include nested patterns and extensions that provide enhanced adhesion along LED chip perimeters.

In one aspect, an LED chip comprises: an active LED structure comprising an n-type layer, a p-type layer, and an active layer arranged between the n-type layer and the p-type layer, the active LED structure forming a first opening that extends through the p-type layer, the active layer, and a portion of the n-type layer; a dielectric material on a portion of the n-type layer within the first opening; and an n-contact interconnect that is electrically connected to the n-type layer within the first opening, the n-contact interconnect forming edges that extend from the n-contact interconnect to electrically contact the n-type layer around a perimeter of the dielectric material. The LED chip may further comprise: a reflective structure on the p-type layer, wherein the reflective structure comprises a dielectric layer and a metal layer; and a reflective layer interconnect that extends through a second opening of the dielectric layer; wherein the dielectric material on the portion of the n-type layer within the first opening comprises a same material as the dielectric layer of the reflective structure. In certain embodiments, a portion of the dielectric layer is arranged within the second opening and the reflective layer interconnect forms edges that extend from the reflective layer interconnect to electrically connect with the p-type layer.

In another aspect, an LED chip comprises: an active LED structure comprising an n-type layer, a p-type layer, and an active layer arranged between the n-type layer and the p-type layer; a reflective structure on the p-type layer, the reflective structure comprising a dielectric layer, a metal layer, and a dielectric layer opening that is formed through the dielectric layer, a portion of the dielectric layer being arranged within the dielectric layer opening; and a reflective layer interconnect that extends through the dielectric layer opening, the reflective layer interconnect forming edges that extend from the reflective layer interconnect to electrically connect with the p-type layer.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
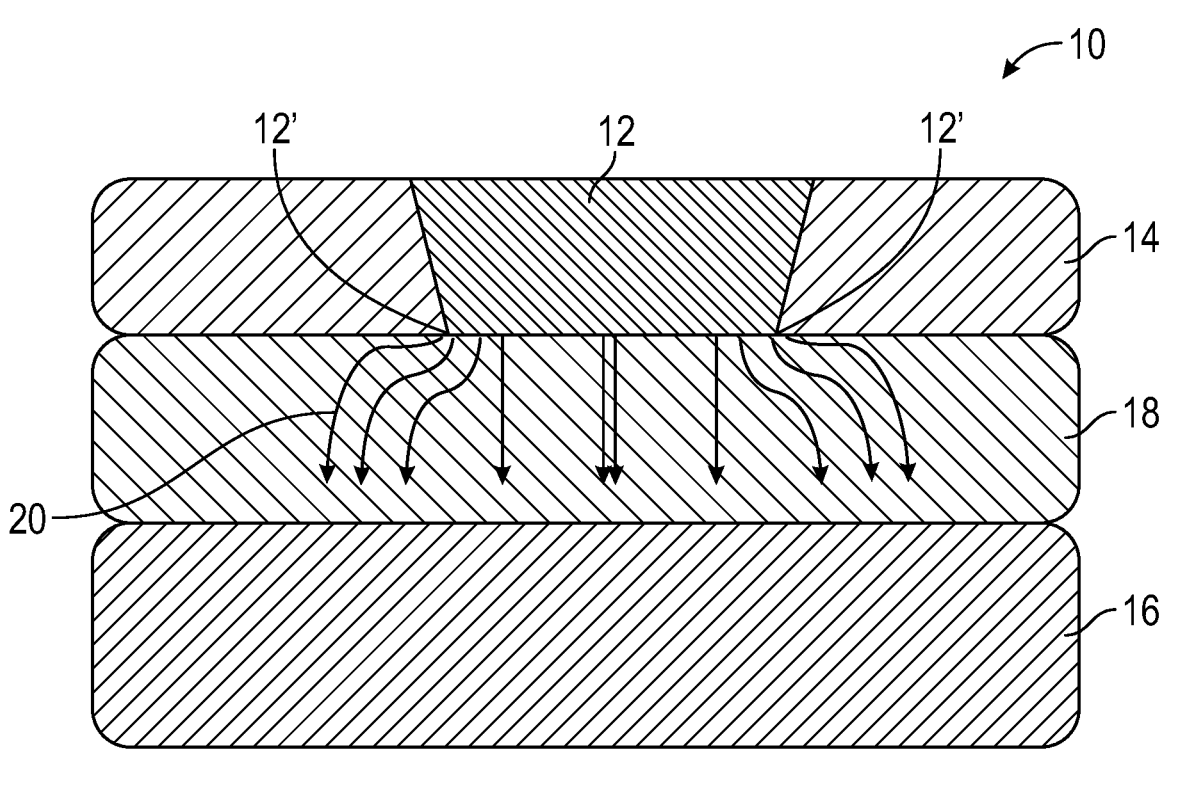
FIG. 1 is a general cross-section of a portion of a light-emitting diode (LED) chip that includes an interconnect that provides an electrically conductive path through a dielectric layer.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to solid-state lighting devices including light-emitting diodes (LEDs) and more particularly to interconnect structures for improved LED chip performance. Interconnect structures are disclosed within LED chips that are structured to increase perimeter contact areas within localized LED chip areas without substantial increases to overall areas occupied by the interconnect structures. By increasing contact perimeters of interconnects within a certain area, increased current injection efficiency may be provided.

Interconnect structures for increased current injection are disclosed for both n-type layers and p-type layers. Interconnect structures may include patterned dielectric materials within interconnect openings and corresponding interconnects that are formed around the patterned dielectric materials. Additional interconnect structures include nested patterns and extensions that provide enhanced adhesion along LED chip perimeters.

An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, un-doped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), GaN, with a suitable substrate being a 4H polytype of SiC, although other SiC polytypes can also be used including 3C, 6H, and 15R polytypes. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light transmissive optical properties.

Different embodiments of the active LED structure can emit different wavelengths of light depending on the composition of the active layer and n-type and p-type layers. In certain embodiments, the active LED structure may emit blue light with a peak wavelength range of approximately 430 nanometers (nm) to 480 nm. In other embodiments, the active LED structure may emit green light with a peak wavelength range of 500 nm to 570 nm. In other embodiments, the active LED structure may emit red light with a peak wavelength range of 600 nm to 650 nm. In certain embodiments, the active LED structure may emit light with a peak wavelength in any area of the visible spectrum, for example peak wavelengths primarily in a range from 400 nm to 700 nm.

In certain embodiments, the active LED structure may be configured to emit light that is outside the visible spectrum, including one or more portions of the ultraviolet (UV) spectrum, the infrared (IR) or near-IR spectrum. The UV spectrum is typically divided into three wavelength range categories denoted with letters A, B, and C. In this manner, UV-A light is typically defined as a peak wavelength range from 315 nm to 400 nm, UV-B is typically defined as a peak wavelength range from 280 nm to 315 nm, and UV-C is typically defined as a peak wavelength range from 100 nm to 280 nm. UV LEDs are of particular interest for use in applications related to the disinfection of microorganisms in air, water, and surfaces, among others. In other applications, UV LEDs may also be provided with one or more lumiphoric materials to provide LED packages with aggregated emissions having a broad spectrum and improved color quality for visible light applications. Near-IR and/or IR wavelengths for LED structures of the present disclosure may have wavelengths above 700 nm, such as in a range from 750 nm to 1100 nm, or more.

The LED chip can also be covered with one or more lumiphoric or other conversion materials, such as phosphors, such that at least some of the light from the LED chip is absorbed by the one or more phosphors and is converted to one or more different wavelength spectra according to the characteristic emission from the one or more phosphors. In some embodiments, the combination of the LED chip and the one or more phosphors emits a generally white combination of light. The one or more phosphors may include yellow (e.g., YAG:Ce), green (e.g., LuAg:Ce), and red (e.g., $Ca_{1-x-y}Sr_xEu_yAlSiN_3$) emitting phosphors, and combinations thereof. Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. In some embodiments, one or more phosphors may include yellow phosphor (e.g., YAG:Ce), green phosphor (e.g., LuAg:Ce), and red phosphor (e.g., $Ca_{1-x-y}Sr_xEu_y$-AlSiN$_3$) and combinations thereof. One or more lumiphoric materials may be provided on one or more portions of an LED chip and/or a submount in various configurations. In certain embodiments, one or more surfaces of LED chips may be conformally coated with one or more lumiphoric materials, while other surfaces of such LED chips and/or associated submounts may be devoid of lumiphoric material. In certain embodiments, a top surface of an LED chip may include lumiphoric material, while one or more side surfaces of an LED chip may be devoid of lumiphoric material. In certain embodiments, all or substantially all outer surfaces of an LED chip (e.g., other than contact-defining or mounting surfaces) are coated or otherwise covered with one or more lumiphoric materials. In certain embodiments, one or more lumiphoric materials may be arranged on or over one or more surfaces of an LED chip in a substantially uniform manner. In other embodiments, one or more lumiphoric materials may be arranged on or over one or more surfaces of an LED chip in a manner that is non-uniform with respect to one or more of material composition, concentration, and thickness. In certain embodiments, the loading percentage of one or more lumiphoric materials may be varied on or among one or more outer surfaces of an LED chip. In certain embodiments, one or more lumiphoric materials may be patterned on portions of one or more surfaces of an LED chip to include one or more stripes, dots, curves, or polygonal shapes. In certain embodiments, multiple lumiphoric materials may be arranged in different discrete regions or discrete layers on or over an LED chip.

Light emitted by the active layer or region of an LED chip is typically initiated in multiple directions. For directional applications, internal mirrors or external reflective surfaces may be employed to redirect as much light as possible toward a desired emission direction. Internal mirrors may include single or multiple layers. Some multi-layer mirrors include a metal reflector layer and a dielectric reflector layer, wherein the dielectric reflector layer is arranged between the metal reflector layer and a plurality of semiconductor layers. A passivation layer is arranged between the metal reflector layer and first and second electrical contacts, wherein the first electrical contact is arranged in conductive electrical communication with a first semiconductor layer, and the second electrical contact is arranged in conductive electrical communication with a second semiconductor layer. For single or multi-layer mirrors including surfaces exhibiting less than 100% reflectivity, some light may be absorbed by the mirror. Additionally, light that is redirected through the active LED structure may be absorbed by other layers or elements within the LED chip.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of UV LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

The present disclosure can be useful for LED chips having a variety of geometries, such as vertical geometry. A vertical geometry LED chip typically includes anode and cathode connections on opposing sides or faces of the LED chip. In certain embodiments, a vertical geometry LED chip may also include a growth substrate that is arranged between the anode and cathode connections. In certain embodiments, LED chip structures may include a carrier submount and where the growth substrate is removed. In still further embodiments, any of the principles described may also be applicable to flip-chip structures where anode and cathode connections are made from a same side of the LED chip for flip-chip mounting to another surface.

Embodiments of the present disclosure provide interconnect structures, or vias, within LED chips that are structured to increase the perimeter contact areas of the interconnects within a same contact area for increasing efficiency of current injection. Since the majority of the current is typically ejected at the edge of the interconnects, the effective amount of useful current injection area can be increased by increasing a length of interconnect edges. For solid surfaces, it is well known that the shape with the largest perimeter to area is a circle. In certain embodiments, a circular interconnect structure is subdivided into concentric rings where the perimeter is increased without substantially increasing an area of the chip occupied by the interconnect. Such arrangements are applicable to both n-contact interconnects and p-type interconnects. In certain LED chip structures, p-type interconnects may also be referred to as reflective layer interconnects or p-vias. In certain embodiment, reflective layer interconnect structures are provided that increase current injection efficiency while also forming a seal along perimeter chip edges of the LED chip for decreased delamination of chip elements, such as reflective structures or mirrors. Such perimeter structures may also serve to push increased current to the outside of the LED chip.

FIG. 1 is a general cross-section of a portion of an LED chip 10 that includes an interconnect 12, or via, that provides an electrically conductive path through a dielectric layer 14. For example, the interconnect 12 may be electrically coupled to a semiconductor layer 16 and/or an intervening current spreading layer 18. In the context of an LED chip structure, the semiconductor layer 16 may embody an n-type layer or a p-type layer of an active LED structure, and the current spreading layer 18 may embody a layer of conductive material, for example a transparent conductive oxide such indium tin oxide (ITO) or a metal such as platinum (Pt), although other materials may be used. In such an arrangement, a majority of current 20 is ejected along one or more edges 12' of the interconnect 12, with less amounts of the current 20 being ejected centrally with respect to the interconnect 12. In this manner, current injection into the semiconductor layer 16 and the current spreading layer 18 is non-uniform across a contact area at the interface between the interconnect 12 and the current spreading layer 18.

Figure 2:
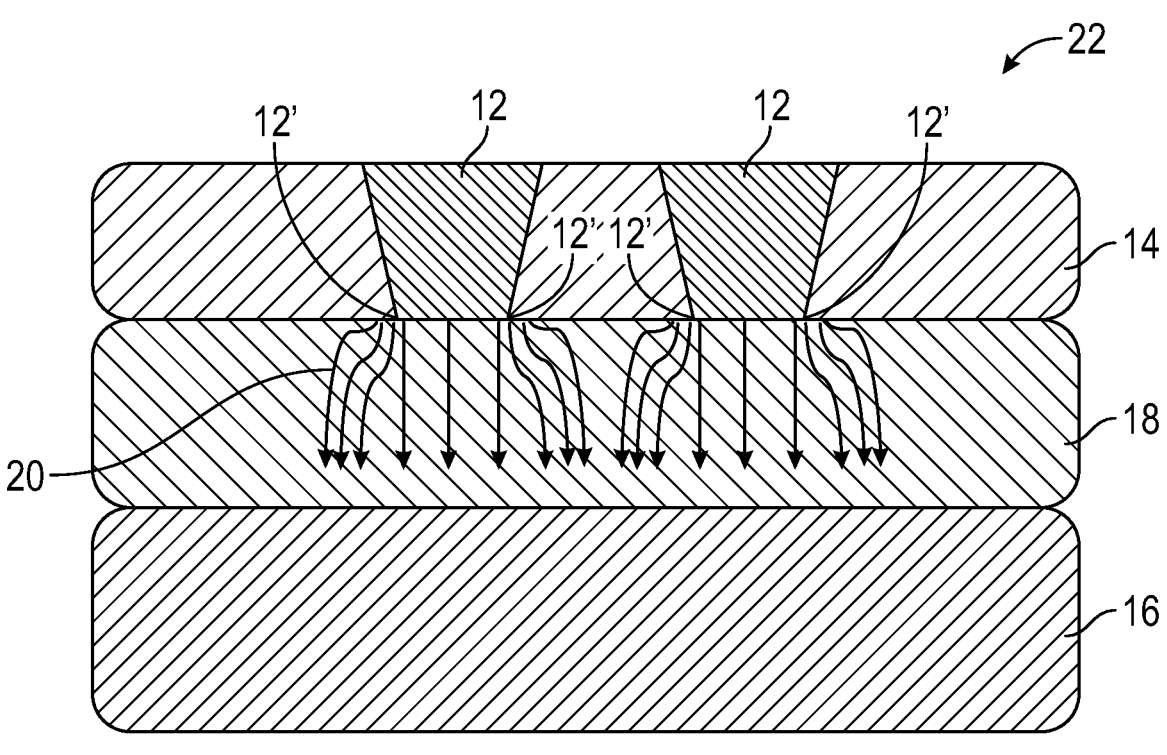
FIG. 2 is a general cross-section of a portion of an LED chip that is similar to the LED chip of FIG. 1 except an interconnect structure is provided that increases current injection into a semiconductor layer for a same chip area.

FIG. 2 is a general cross-section of a portion of an LED chip 22 that is similar to the LED chip 10 of FIG. 1 except an interconnect structure is provided that increases current injection into the semiconductor layer 16 for a same chip area. In FIG. 2, two smaller interconnects 12 are formed to contact the current spreading layer 18 with a spacing that corresponds to a width of the interconnect 12 of FIG. 1. In this manner, the interconnects 12 of FIG. 2 may reside within a same area of the LED chip 22 as the area occupied by the single interconnect 12 of the LED chip 10 of FIG. 1. As illustrated, such an arrangement forms an increased area of one or more edges 12' of the interconnects 12 within the same chip area such that increased current 20 is ejected from the interconnects 12 and into the current spreading layer 18 and the semiconductor layer 16. In this regard, an effective amount of useful current injection area can be increased. In certain embodiments, the interconnects 12 may be separate structures while in other embodiments, the interconnects 12 may be extensions from a same interconnect structure.

Figure 3A:
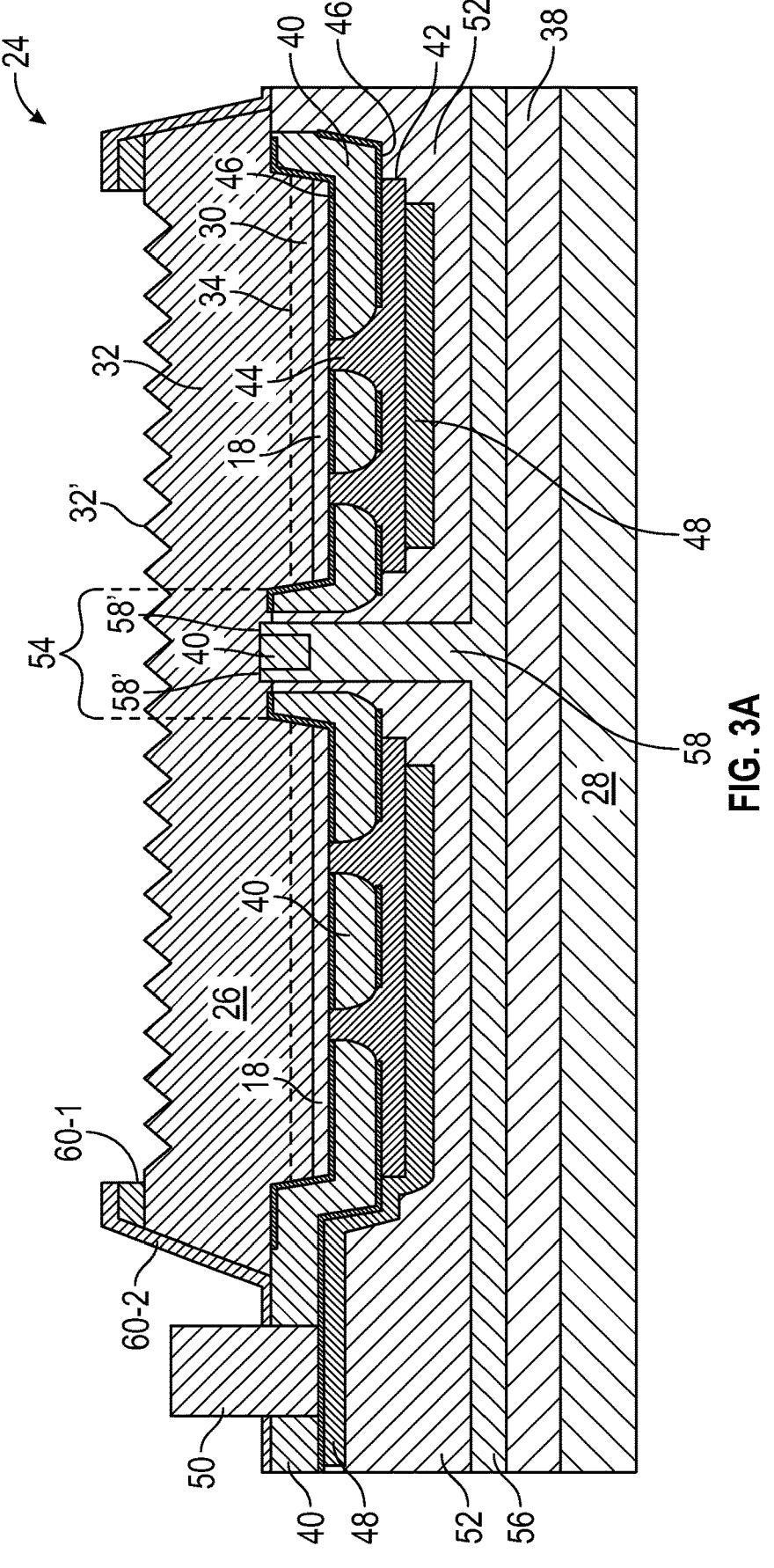
FIG. 3A is a generalized cross-section of an LED chip that includes an interconnect structure as described above for FIG. 2.

FIG. 3A is a generalized cross-section of an LED chip 24 that includes an interconnect structure as described above for FIG. 2. The LED chip 24 includes an active structure 26 formed on a carrier submount 28. As used herein, the active structure 26 may also be referred to as an active LED structure. The active structure 26 generally refers to portions of the LED chip 24 that include semiconductor layers, such as epitaxial semiconductor layers, that form a structure that generates light when electrically activated. The carrier submount 28 can be made of many different materials, with a suitable material being silicon, or doped silicon. In certain embodiments, the carrier submount 28 comprises an electrically conductive material such that the carrier submount 28 is part of electrically conductive connections to the active structure 26. The active structure 26 may generally comprise a p-type layer 30, an n-type layer 32, and an active layer 34 arranged between the p-type layer 30 and the n-type layer 32. The active LED structure 26 may include many additional layers such as, but not limited to, buffer layers, nucleation layers, super lattice structures, un-doped layers, cladding layers, contact layers, current-spreading layers, and light extraction layers and elements. Additionally, the active layer 34 may comprise a single quantum well, a multiple quantum well, a double heterostructure, or super lattice structures. In FIG. 3A, the p-type layer 30 is arranged between the active layer 34 and the carrier submount 28 such that the p-type layer 30 is closer to the carrier submount 28 than the n-type layer 32. The active LED structure 26 may initially be formed by epitaxially growing or depositing the n-type layer 32, the active layer 34, and the p-type layer 30 sequentially on a growth substrate. The active LED structure 26 may then be flipped and bonded to the carrier submount 28 by way of one or more bond metals 38 and the growth substrate is removed. In this manner, a top surface 32' of the n-type layer 32 forms a primary light extracting face of the LED chip 24. In certain embodiments, the top surface 32' may comprise a textured or patterned surface for improving light extraction. In other embodiments, the doping order may be reversed such that n-type layer 32 is arranged between the active layer 34 and the carrier submount 28.

The LED chip 24 may include a first reflective layer 40 that is provided on the p-type layer 14. In certain embodiments, the current spreading layer 18 may be provided between the p-type layer 30 and the first reflective layer 40. As described above, the current spreading layer 18 may include a thin layer of a transparent conductive oxide such as ITO or a thin metal layer such as Pt, although other materials may be used. The first reflective layer 40 may comprise many different materials and preferably comprises a material that presents an index of refraction step with the material of the active LED structure 26 to promote total internal reflection (TIR) of light generated from the active LED structure 26. Light that experiences TIR is redirected without experiencing absorption or loss and can thereby contribute to useful or desired LED chip emission. In certain embodiments, the first reflective layer 40 comprises a material with an index of refraction lower than the index of refraction of the active LED structure 26 material. The first reflective layer 40 may comprise many different materials, with some having an index of refraction less than 2.3, while others can have an index of refraction less than 2.15, less than 2.0, and less than 1.5. In certain embodiments, the first reflective layer 40 comprises a dielectric material, such as silicon dioxide ($SiO_2$) and/or silicon nitride (SiN). It is understood that many dielectric materials can be used such as SiN, SiNx, $Si_3N_4$, Si, germanium (Ge), $SiO_2$, SiOx, titanium dioxide ($TiO_2$), tantalum pentoxide ($Ta_2O_5$), ITO, magnesium oxide (MgOx), zinc oxide (ZnO), and combinations thereof. In certain embodiments, the first reflective layer 40 may include multiple alternating layers of different dielectric materials, e.g., alternating layers of $SiO_2$ and SiN that symmetrically repeat or are asymmetrically arranged. Some Group III nitride materials such as GaN can have an index of refraction of approximately 2.4, and $SiO_2$ can have an index of refraction of approximately 1.48, and SiN can have an index of refraction of approximately 1.9. Embodiments with an active LED structure 26 comprising GaN and the first reflective layer 40 that comprises $SiO_2$ may form a sufficient index of refraction step between the two to allow for efficient TIR of light. The first reflective layer 40 may have different thicknesses depending on the type of materials used, with some embodiments having a thickness of at least 0.2 microns (μm). In some of these embodiments, the first reflective layer 40 can have a thickness in the range of 0.2 μm to 0.7 μm, while in some embodiments the thickness can be approximately 0.5 μm.

The LED chip 24 may further include a second reflective layer 42 that is on the first reflective layer 40 such that the first reflective layer 40 is arranged between the active LED structure 26 and the second reflective layer 42. The second reflective layer 42 may include a metal layer that is configured to reflect light from the active LED structure 26 that may pass through the first reflective layer 40. The second reflective layer 42 may comprise many different materials such as Ag, gold (Au), Al, nickel (Ni), titanium (Ti), or combinations thereof. The second reflective layer 42 may have different thicknesses depending on the type of materials used, with some embodiments having a thickness of at least 0.1 μm, or in a range including 0.1 μm to 0.7 μm, or in a range including 0.1 μm to 0.5 μm, or in a range including 0.1 μm to 0.3 μm. As illustrated, the second reflective layer 42 may include or form one or more reflective layer interconnects 44 that provide an electrically conductive path through the first reflective layer 40. In this manner, the one or more reflective layer interconnects 44 may extend through an entire thickness of the first reflective layer 40. In certain embodiments, the second reflective layer 42 is a metal reflective layer and the reflective layer interconnects 44 comprise reflective layer metal vias. Accordingly, the first reflective layer 40, the second reflective layer 42, and the reflective layer interconnects 44 form a reflective structure of the LED chip 24 that is on the p-type layer 30. As such, the reflective structure may comprise a dielectric reflective layer and a metal reflective layer as disclosed herein. In certain embodiments, the reflective layer interconnects 44 comprise the same material as the second reflective layer 42 and are formed at the same time as the second reflective layer 42. In other embodiments, the reflective layer interconnects 44 may comprise a different material than the second reflective layer 42. Certain embodiments may also comprise an adhesion layer 46 that is positioned at one or more interfaces between the first reflective layer 40 and the second reflective layer 42 and/or interfaces between the first reflective layer 40 and the current spreading layer 18 to promote improved adhesion therebetween. Many different materials can be used for the adhesion layer 46, such as titanium oxide (TiO, $TiO_2$), titanium oxynitride (TiON, $Ti_xO_yN$), tantalum oxide (TaO, $Ta_2O_5$), tantalum oxynitride (TaON), aluminum oxide (AlO, $Al_xO_y$) or combinations thereof, with a preferred material being TiON, AlO, or AlxOy. In certain embodiments, the adhesion layer comprises $Al_xO_y$, where 1≤x≤4 and 1≤y≤6. In certain embodiments, the adhesion layer comprises $Al_xO_y$, where x=2 and y=3, or $Al_2O_3$. The adhesion layer 46 may be deposited by electron beam deposition that may provide a smooth, dense, and continuous layer without notable variations in surface morphology. The adhesion layer 46 may also be deposited by sputtering, chemical vapor deposition, plasma enhanced chemical vapor deposition, or atomic layer deposition (ALD).

The LED chip 24 may also comprise a barrier layer 48 on the second reflective layer 42 to prevent migration of material of the second reflective layer 42, such as Ag, to other layers. Preventing this migration helps the LED chip 24 maintain efficient operation throughout its lifetime. The barrier layer 48 may comprise an electrically conductive material, with suitable materials including but not limited Ti, Pt, Ni, Au, tungsten (W), and combinations or alloys thereof. In certain embodiments, the barrier layer 48 is arranged to laterally extend beyond portions of the active LED structure 26, or a peripheral border of the active LED structure 26 in order to provide an electrical connection with a p-contact 50. In this regard, an electrical path between the p-contact 50 and the p-type layer 30 may include the barrier layer 48, the second reflective layer 42, and the reflective layer interconnects 44. In other embodiments, the polarity may be reversed such that the p-contact 50 is replaced with an n-contact that is electrically coupled to the n-type layer 32, and electrical connections to the p-type layer 30 are made through the carrier submount 28. A passivation layer 52 is included on the barrier layer 48 as well as any portions of the second reflective layer 42 that may be uncovered by the barrier layer 48. The passivation layer 52 protects and provides electrical insulation for the LED chip 24 and can comprise many different materials, such as a dielectric material including but not limited to silicon nitride. In certain embodiments, the passivation layer 52 is a single layer, and in other embodiments, the passivation layer 52 comprises a plurality of layers. In certain embodiments, the passivation layer 52 may include one or more metal-containing interlayers arranged or embedded therein that may function as a crack stop layer for any cracks that may propagate through the passivation layer 52 as well as an additional light reflective layer.

In FIG. 3A, the active LED structure 26 forms a first opening 54 or recess that extends through the p-type layer 30, the active layer 34, and a portion of the n-type layer 32. The first opening 54 may be formed by a subtractive material process, such as etching, that is applied to the active LED structure 26 before bonding with the carrier submount 28. As used herein, the first opening 54 may also be referred to as an active LED structure opening. As illustrated, a portion of the first reflective layer 40, and adhesion layer 46, is arranged to cover sidewall surfaces of the p-type layer 30, the active layer 34, and the n-type layer 32 within the first opening 54. The passivation layer 52 extends along the first reflective layer 40 in the first opening 54 and is arranged on a surface of the n-type layer 32. The LED chip 24 further includes an n-contact metal layer 56 that is arranged on the passivation layer 52 and across the LED chip 24. At the first opening 54, the n-contact metal layer 56 extends into the first opening 54 to form an n-contact interconnect 58, which may be referred to as an n-contact via. In this manner, the first opening 54 may be defined where portions of the n-contact metal layer 56, the n-contact interconnect 58, the passivation layer 52, and the first reflective layer 40 extend into the active LED structure 26. As such, the n-contact metal layer 56 and the n-contact interconnect 58 may be integrally formed to provide an electrical connection to the n-type layer 32 through the first opening 54. In other embodiments, the n-contact metal layer 56 and the n-contact interconnect 58 may be separately formed and may comprise the same or different materials. In certain embodiments, the n-contact metal layer 56 and the n-contact interconnect 58 comprise a single layer or a plurality of layers that include conductive metals, such as one or more of Al, Ti, and alloys thereof.

As illustrated, the p-contact 50 may be formed on the barrier layer 48, and one or more top passivation layers 60-1, 60-2 may be provided on one or more top or side surfaces of the n-type layer 32 for additional electrical insulation. The top passivation layers 60-1, 60-2 may comprise separate layers of a continuous layer of dielectric material, such as silicon nitride.

In certain embodiments, the n-contact interconnect 58 may be formed with an interconnect structure similar to the embodiments of FIG. 2. As illustrated in FIG. 3A, a portion of the first reflective layer 40 forms a dielectric material that resides within the opening 54 and on a portion of the n-type layer 32. When the n-contact interconnect 58 is formed through the passivation layer 52, the n-contact interconnect 58 may contact the n-type layer 32 around a perimeter, or an entire perimeter, of the portion of the first reflective layer 40 within the opening 54. In this manner, the n-contact interconnect 58 may be formed with increased amounts of one or more edges 58' to provide enhanced current injection as described for FIG. 2. As illustrated, the interconnect structure of FIG. 3A includes an arrangement where the n-contact interconnect 58 is a continuous solid material through portions of the passivation layer 52 before effectively splitting around the portion of the first reflective layer 40 to provide the multiple edges 58' at the n-type layer 32. In this manner, the edges 58' are portions that extend from the n-contact interconnect 58 to electrically connect with portions of the n-type layer 32 within the opening 54 and adjacent to the portion of the first reflective layer 40.

Figure 3B:
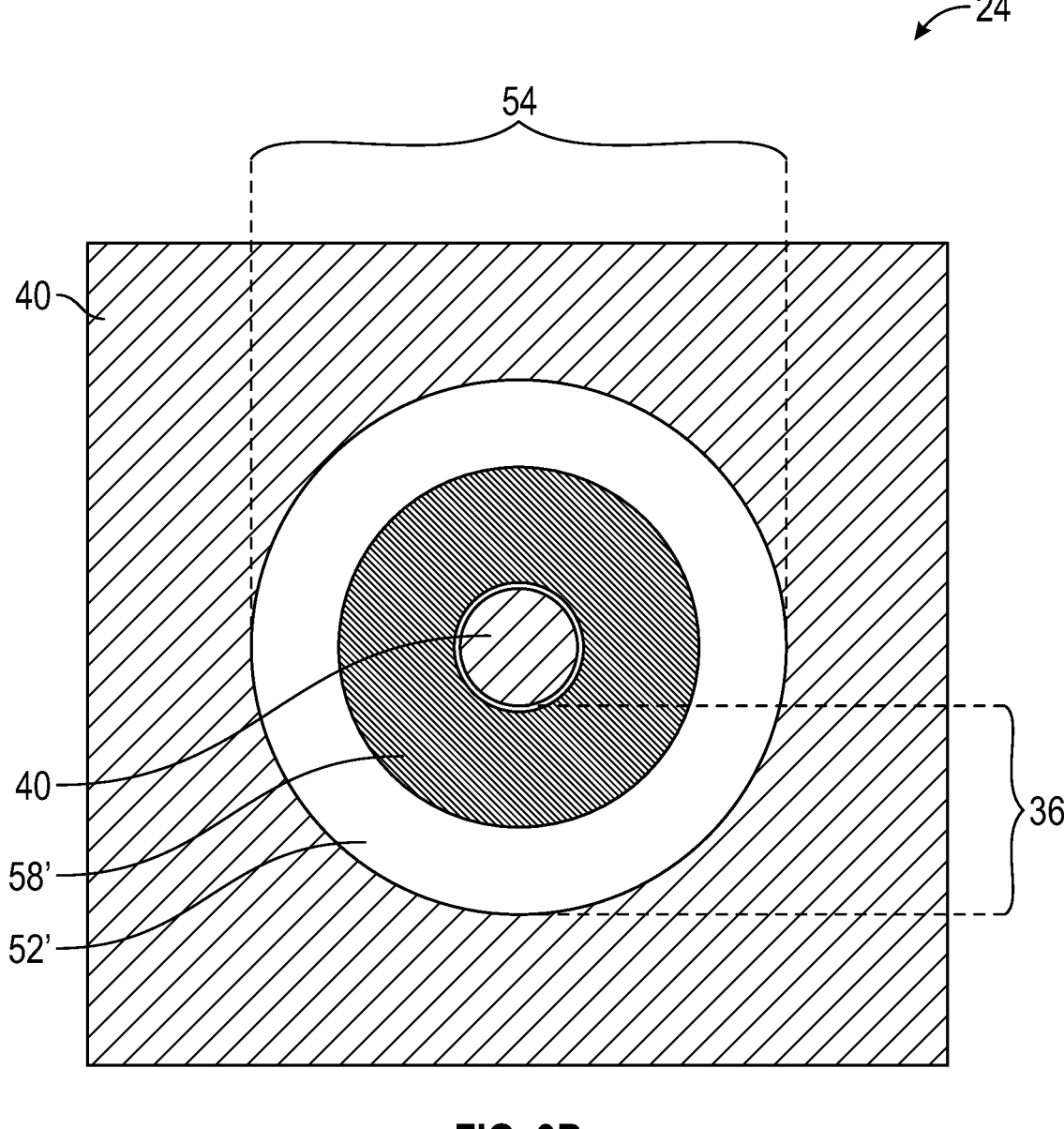
FIG. 3B is a top view of a portion of the LED chip of FIG. 3A at a fabrication step before the LED chip is flipped and bonded to a carrier submount.

FIG. 3B is a top view of a portion of the LED chip 24 of FIG. 3A at a fabrication step before the LED chip 24 is flipped and bonded to the carrier submount 28. The fabrication step of FIG. 3B illustrates an etch pattern for removing portions of the first reflective layer 40. In this manner, the top view of FIG. 3B is from the perspective of the first reflective layer 40 before it is inverted as illustrated in FIG. 3A. During fabrication, the first reflective layer 40 may be blanket deposited across the p-type layer 30 and current spreading layer 18 of FIG. 3A and within the opening 54. In order to provide access to portions of the n-type layer 32 within the opening 54, the first reflective layer 40 is subjected to a patterned etching process within the opening 54. In this manner, a portion of the first reflective layer 40 remains within a center of the opening 54, and the n-type layer 32 is accessible in a radial manner around the first reflective layer 40 within the opening 54 as illustrated by the radial opening 36 of the first reflective layer 40. In FIG. 3B, a location 52' of the passivation layer 52 and a location of the edges 58' of the n-contact interconnect 58 within the opening 54 and within the radial opening 36 around the central portion of the first reflective layer 40 are indicated, as will be later formed at subsequent processing steps. By leaving the portion of the first reflective layer 40 within the opening 54, the n-contact interconnect 58 may accordingly be formed with increased edges for enhanced current injection. While FIG. 3B is provided in the context of a portion of the first reflective layer 40 within the opening 54, the principles disclosed are applicable to any dielectric material formed in the opening 54 to provide the increased contact for edges of the n-contact interconnect 58 and the n-type layer 32.

Figure 4A:
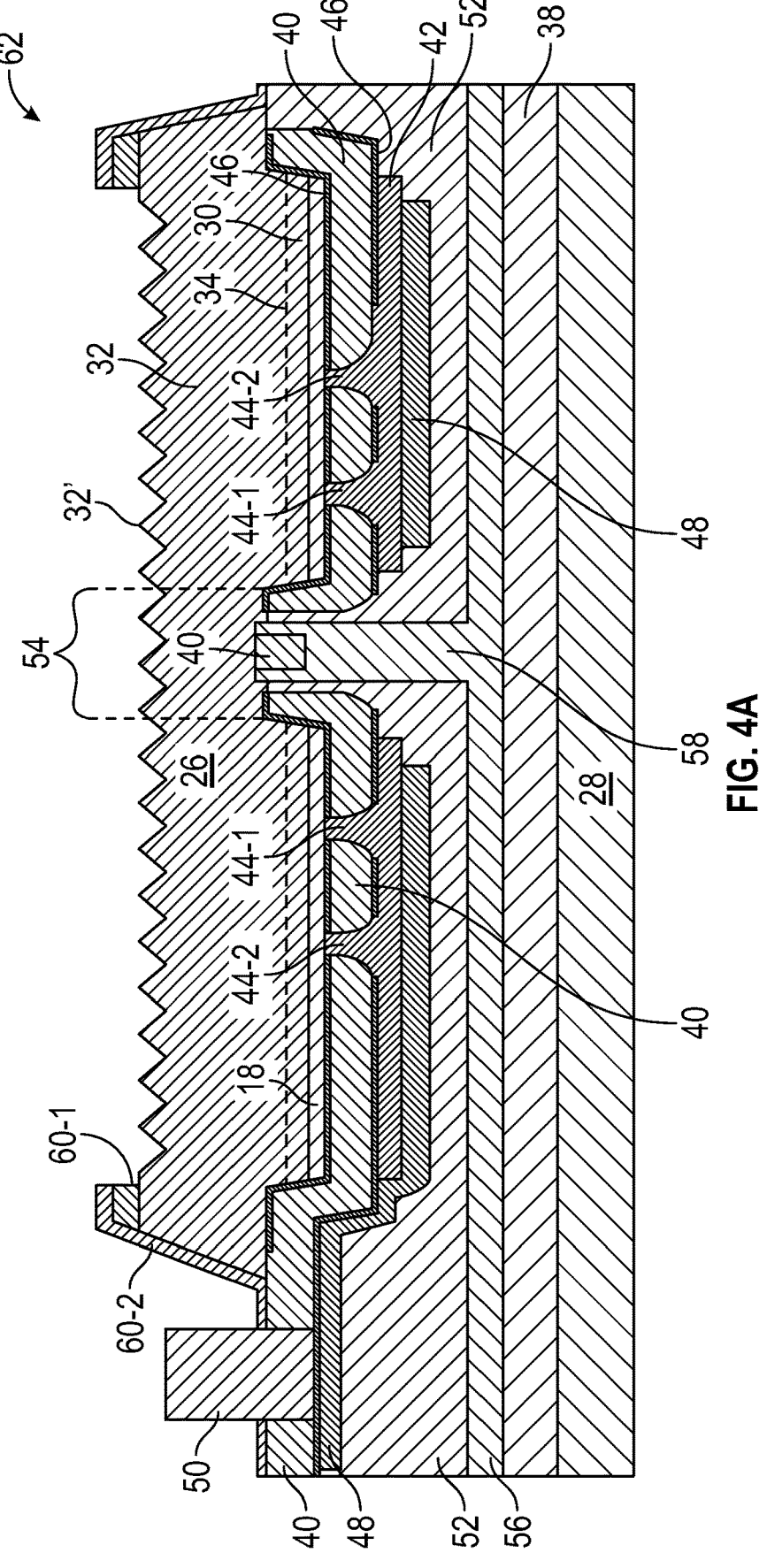
FIG. 4A is a generalized cross-section of an LED chip that is similar to the LED chip of FIG. 3A for embodiments where various reflective layer interconnects are formed with structures that promote enhanced current injection at the p-type layer.

FIG. 4A is a generalized cross-section of an LED chip 62 that is similar to the LED chip 24 of FIG. 3A for embodiments where various reflective layer interconnects 44-1 to 44-2 are formed with structures that promote enhanced current injection at the p-type layer 30. In FIG. 4A, one or more of the reflective layer interconnects 44-1, 44-2 are formed around the n-contact interconnect 58. In the cross-section of FIG. 4A, the first reflective layer interconnect 44-1 is visible on both sides of the n-contact interconnect 58. Accordingly, a first reflective layer interconnect 44-1 may form a ring around the n-contact interconnect 58. A second reflective layer interconnect 44-2 may be formed in a similar manner around a perimeter of the first reflective layer interconnect 44-1 to form concentric rings around the n-contact interconnect 58. In this manner, the reflective layer interconnects 44-1, 44-2 may be formed with increased edges along portions of the p-type layer 30 for enhanced current injection. Such an arrangement for the reflective layer interconnects 44-1, 44-2 may be provided alone or in combination with the interconnect structure of the n-contact interconnect 58 as illustrated in FIG. 4A and described above for FIGS. 3A to 3B.

Figure 4B:
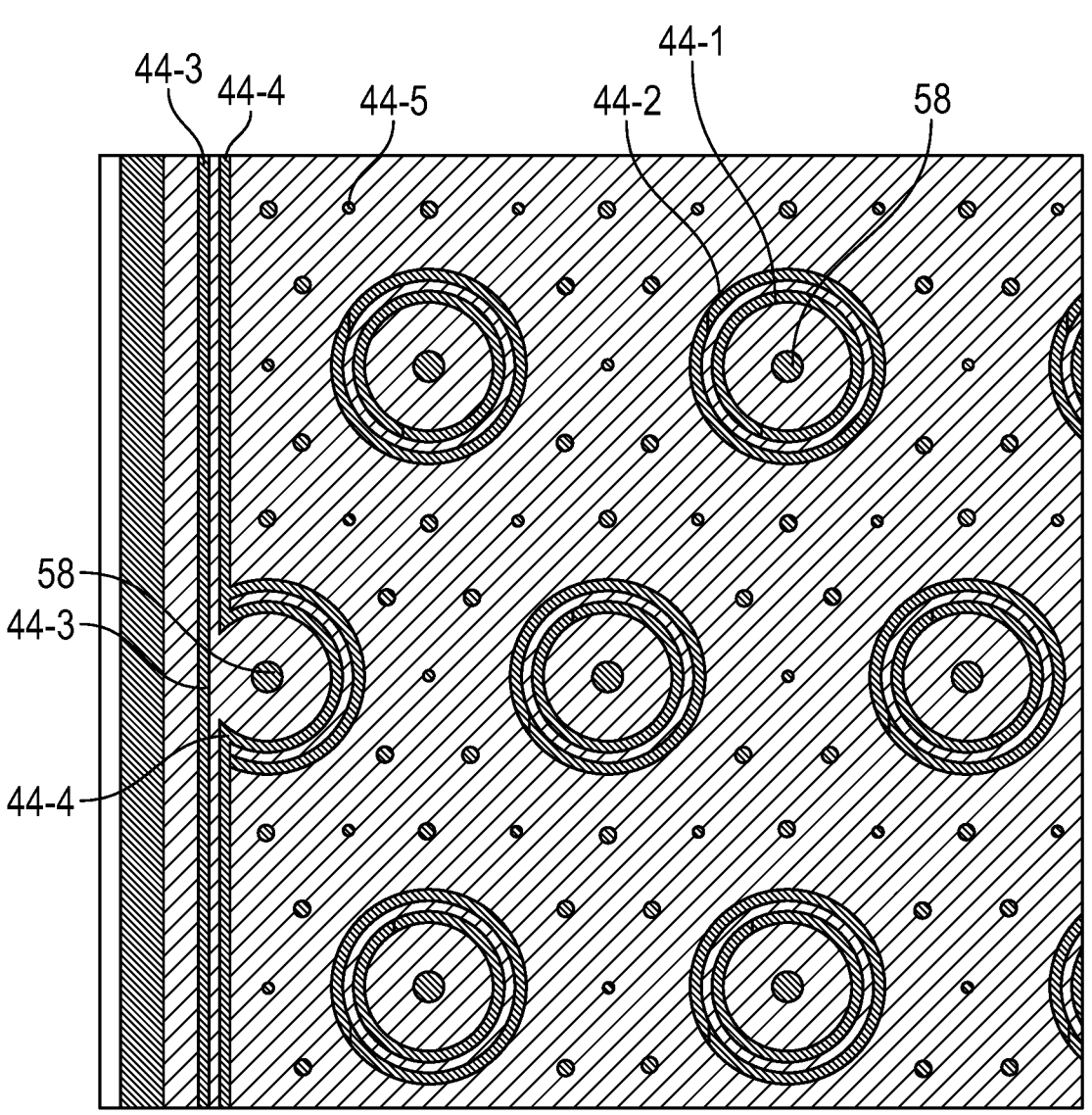
FIG. 4B is a top view of a portion of the LED chip of FIG. 4A at a fabrication step before the LED chip is flipped and bonded to the carrier submount of FIG. 4A.

FIG. 4B is a top view of a portion of the LED chip 62 of FIG. 4A at a fabrication step before the LED chip 62 is flipped and bonded to the carrier submount 28 of FIG. 4A. As illustrated, the reflective layer interconnects 44-1 to 44-2 may be formed as concentric rings around multiple n-contact interconnects 58. In this manner, current injection for the p-type layer 30 may be enhanced at locations closest to the n-contact interconnects 58. As further illustrated, third and fourth reflective layer interconnects 44-3, 44-4 may laterally surround at least one of the n-contact interconnects 58 in proximity to a perimeter of the LED chip 62. The third reflective layer interconnect 44-3 may extend away from the n-contact interconnect 58 and extend along the perimeter of the LED chip 62. In certain embodiments, the fourth reflective layer interconnect 44-4 may also extend away from the n-contact interconnect 58 and along the perimeter of the LED chip 62 in a similar manner. In such areas, the reflective layer interconnects 44-3, 44-4 correspond with areas of the LED chip 62 where material of the second reflective layer 42 contacts the current spreading layer 18 to provide improved adhesion along the perimeter of the LED chip 62. The improved perimeter adhesion may advantageously provide an enhanced seal along the perimeter of the LED chip 62 that may reduce instances of delamination. In certain embodiments, at least one of the reflective layer interconnects 44-3, 44-4, and in some instances both, may traverse along the entire perimeter of the LED chip 62. A number of other reflective layer interconnects 44-5 may form an array pattern of vias throughout a remainder of the LED chip 62 and between reflective layer interconnects 44-1, 44-2 at adjacent n-contact interconnects 58. In certain embodiments, diameters of the reflective layer interconnects 44-5 may decrease with increasing distance from the reflective layer interconnects 44-1, 44-2 and the n-contact interconnects 58 to control current spreading. In particular, reflective layer interconnects 44-5 that are farthest away from the n-contact interconnects 58 may have the smallest diameters.

Figure 5A:
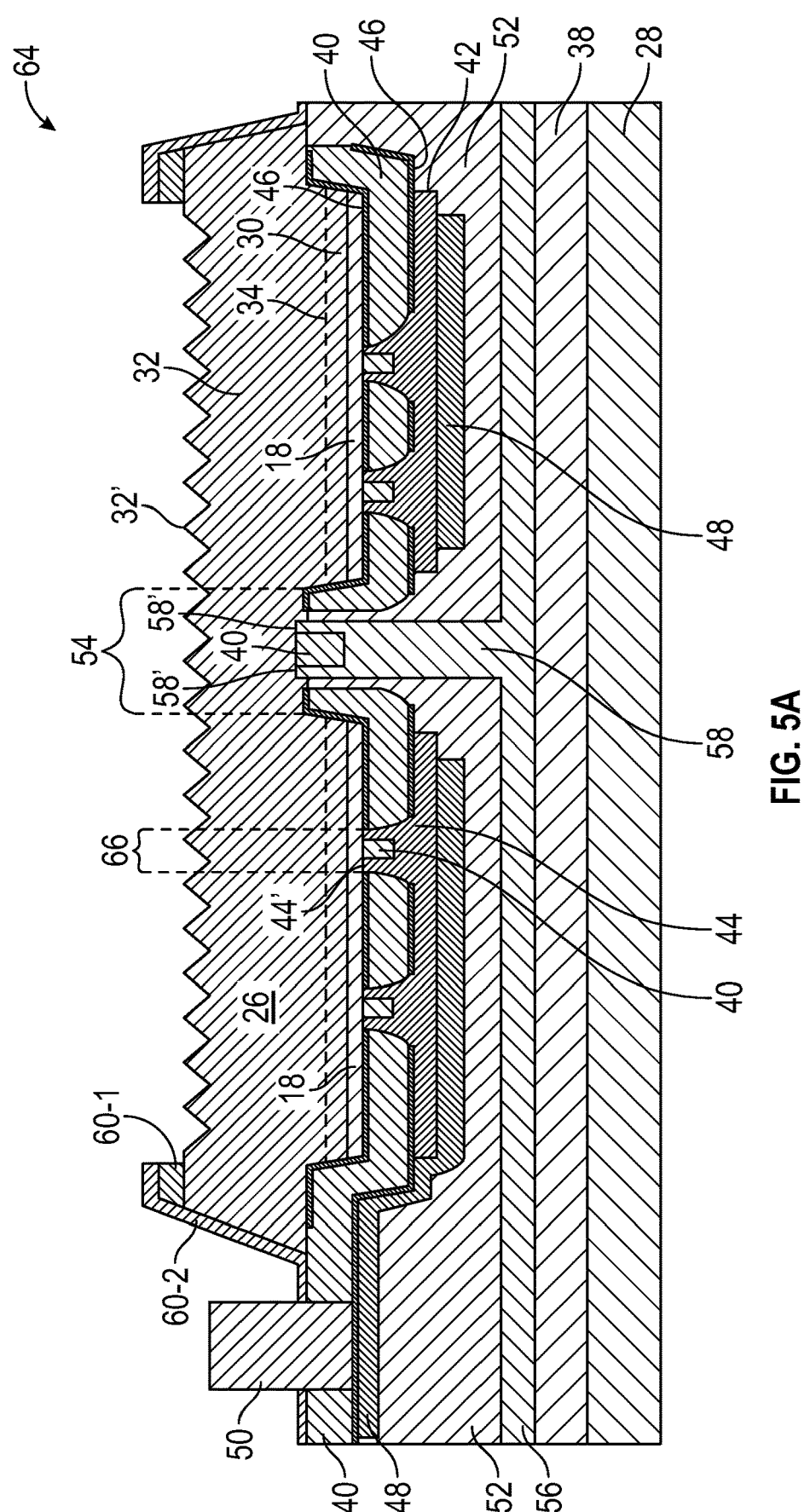
FIG. 5A is a generalized cross-section of another LED chip that is similar to the LED chip of FIG. 3A for embodiments where various reflective layer interconnects are formed with structures that promote enhanced current injection at the p-type layer.

FIG. 5A is a generalized cross-section of another LED chip 64 that is similar to the LED chip 24 of FIG. 3A for embodiments where various reflective layer interconnects 44 are formed with structures that promote enhanced current injection at the p-type layer 30. In FIG. 5A, one or more of the reflective layer interconnects 44 are formed in a similar manner to the n-contact interconnect 58 of FIG. 3A. In this manner, an opening 66 in the first reflective layer 40 is defined where the reflective layer interconnect 44 extends to contact the current spreading layer 18. As used herein, the opening 66 may also be referred to as a first reflective layer opening or a dielectric layer opening. Instead of removing all of the first reflective layer 40 within the opening 66, a portion of the reflective layer 40 is intentionally left within the opening 66 and spaced from the remainder of the first reflective layer 40. In this manner, the reflective layer interconnect 44 may fill the remainder of the opening 66 and form increased edges 44' along the current spreading layer 18 in positions that surround the portion of the first reflective layer 40 within the opening 66. As such, the edges 44' may embody portions of the reflective layer interconnect 44 that extend to electrically connect with portions of the current spreading layer 18 within the opening 66 and adjacent to the portion of the first reflective layer 40.

Figure 5B:
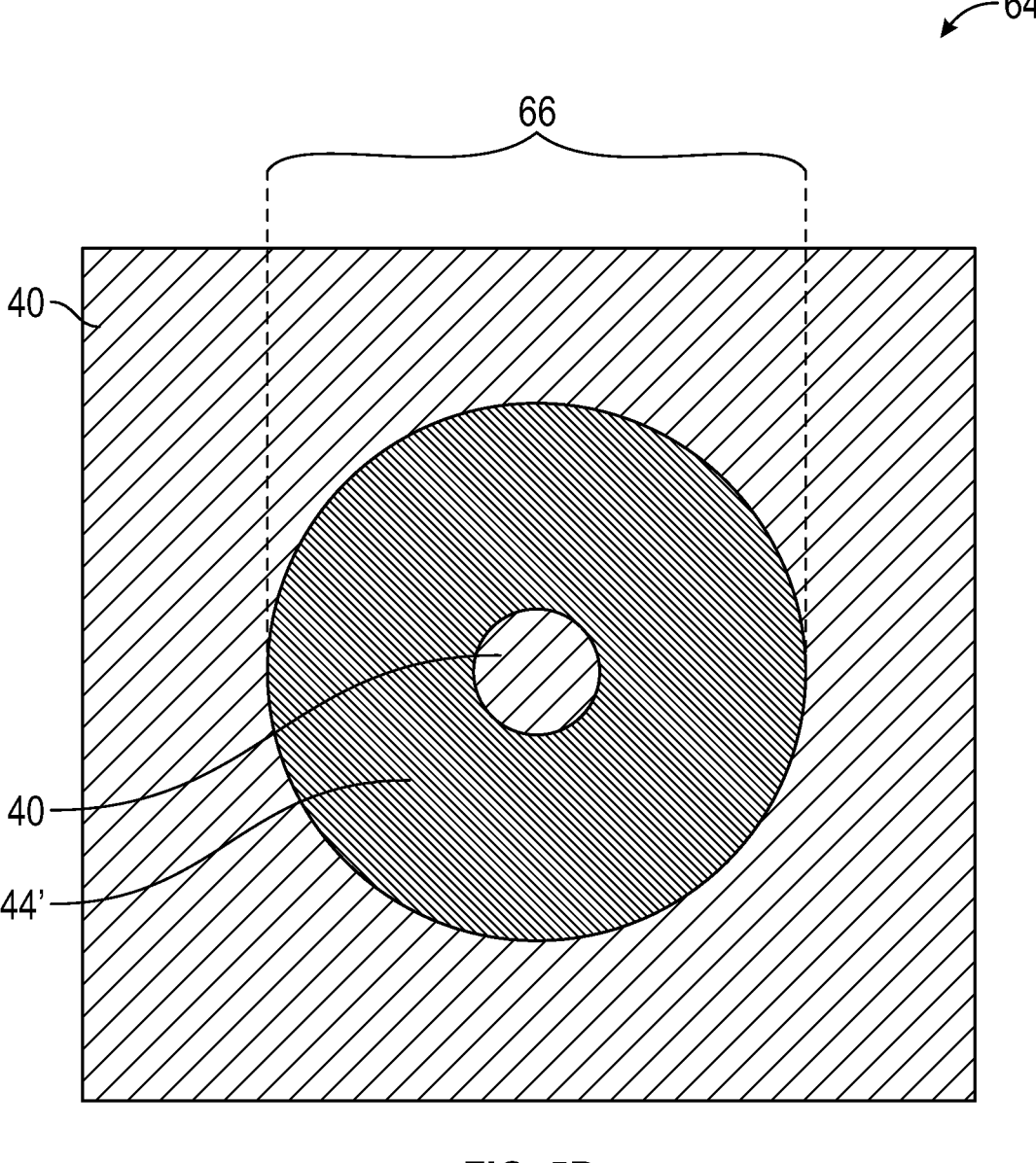
FIG. 5B is a top view of a portion of the LED chip of FIG. 5A at a fabrication step before the LED chip is flipped and bonded to the carrier submount of FIG. 5A.

FIG. 5B is a top view of a portion of the LED chip 64 of FIG. 5A at a fabrication step before the LED chip 64 is flipped and bonded to the carrier submount 28 of FIG. 5A.

The fabrication step of FIG. 5B illustrates an etch pattern for removing portions of the first reflective layer 40. In this manner, the top view of FIG. 5B is from the perspective of the first reflective layer 40 before it is inverted as illustrated in FIG. 3A. During fabrication, the first reflective layer 40 may be blanket deposited across the p-type layer 30 and current spreading layer 18 of FIG. 5A and within the opening 66. In order to provide access to portions of the current spreading layer 18 and/or the p-type layer 30 within the opening 66, the first reflective layer 40 is subjected to a patterned etching process within the opening 66. In this manner, a portion of the first reflective layer 40 remains within a center of the opening 66, and the current spreading layer 18 and/or the p-type layer 30 is accessible in a radial manner around the first reflective layer 40 within the opening 66. In FIG. 5B, a location of the edges 44' of the reflective layer interconnect 44 within the opening 66 is indicated, as will be later formed at subsequent processing steps. By leaving the portion of the first reflective layer within the opening 66, the reflective layer interconnect 44 may accordingly be formed with increased edges for enhanced current injection. While FIG. 5B is provided in the context of a portion of the first reflective layer 40 within opening 66, the principles disclosed are applicable to any dielectric material formed in the opening 66 to provide the increased contact for edges of the reflective layer interconnect 44.

FIGS. 6A to 6D illustrated views of other arrangements of interconnect structures that provide increased current injection according to principles of the present disclosure. FIGS. 6A to 6D are described in the context of n-contact interconnects. However, the principles described are also applicable to reflective layer interconnects. As illustrated in FIGS. 6A to 6D, various nested structures are shown that increase the perimeter surface injected area relative to the contact area, creating a more efficient contact for one or more of the n-type or p-type semiconductor layers of active LED structures. As previously described, openings 36 of the first reflective layer 40 provide access for electrically coupling to underlying layers.

Figure 6B:
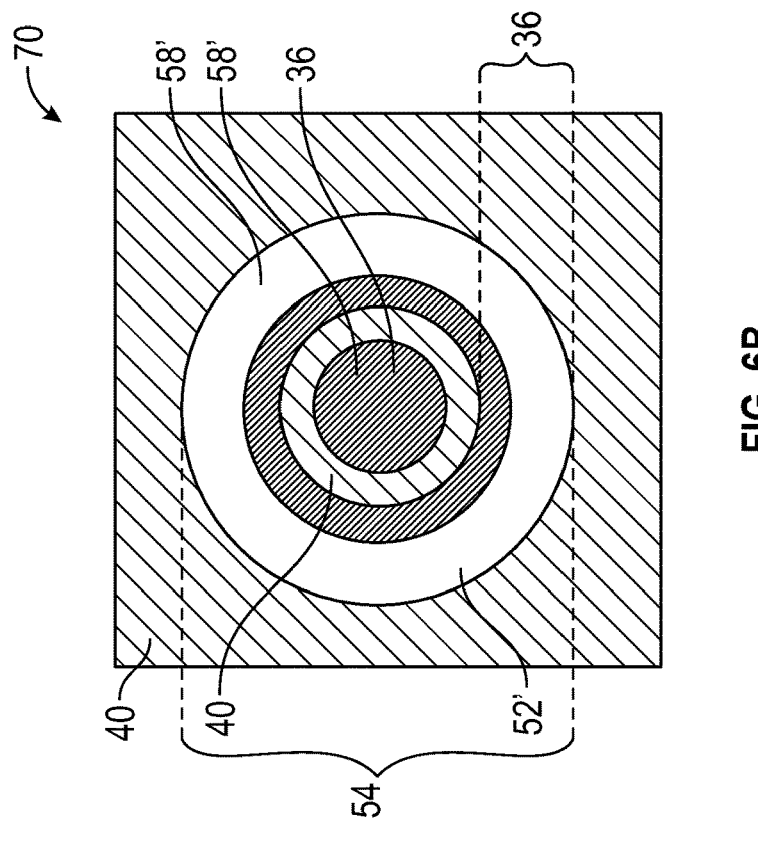
FIG. 6B is a view of a portion of an LED chip that is similar to the LED chip of FIG. 6A for embodiments where the first reflective layer may be provided as a larger circular shape with a larger hollow center.
Figure 6A:
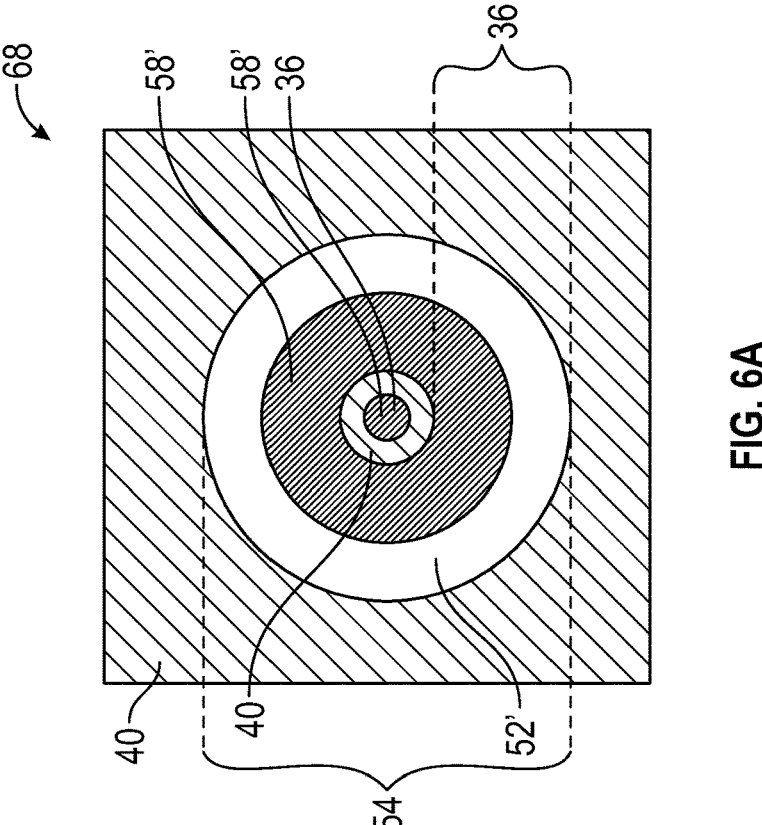
FIG. 6A is a view of a portion of an LED chip that is similar to FIG. 3B with an alternative arrangement of the portion of the first reflective layer within the opening.
Figure 6D:
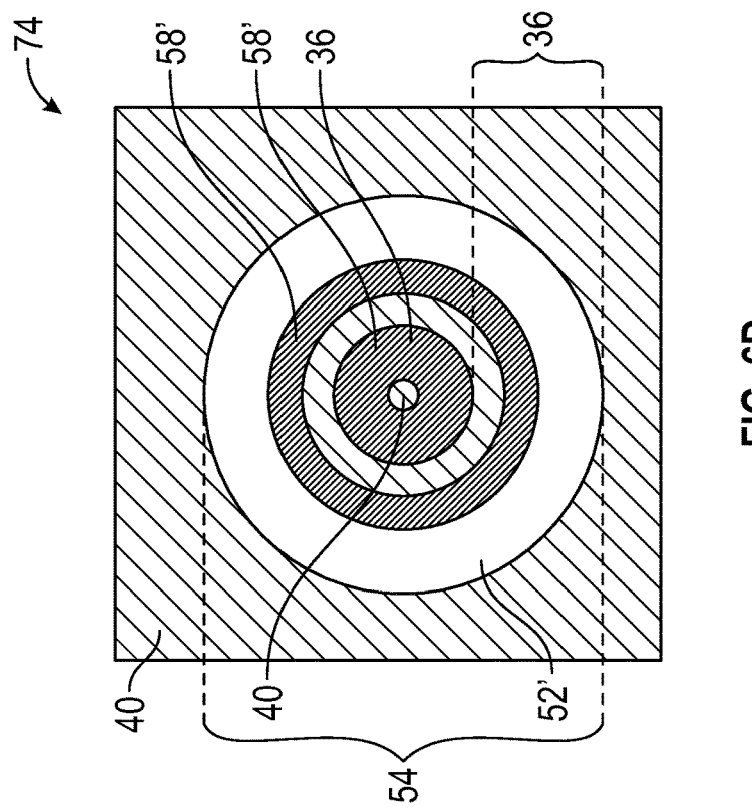
FIG. 6D is a view of a portion of an LED chip that is similar to the LED chip of FIG. 6C for embodiments where the first reflective layer may be provided as a larger circular shape with a larger hollow center and another portion of the first reflective layer is provided with a smaller diameter within the hollow center.
Figure 6C:
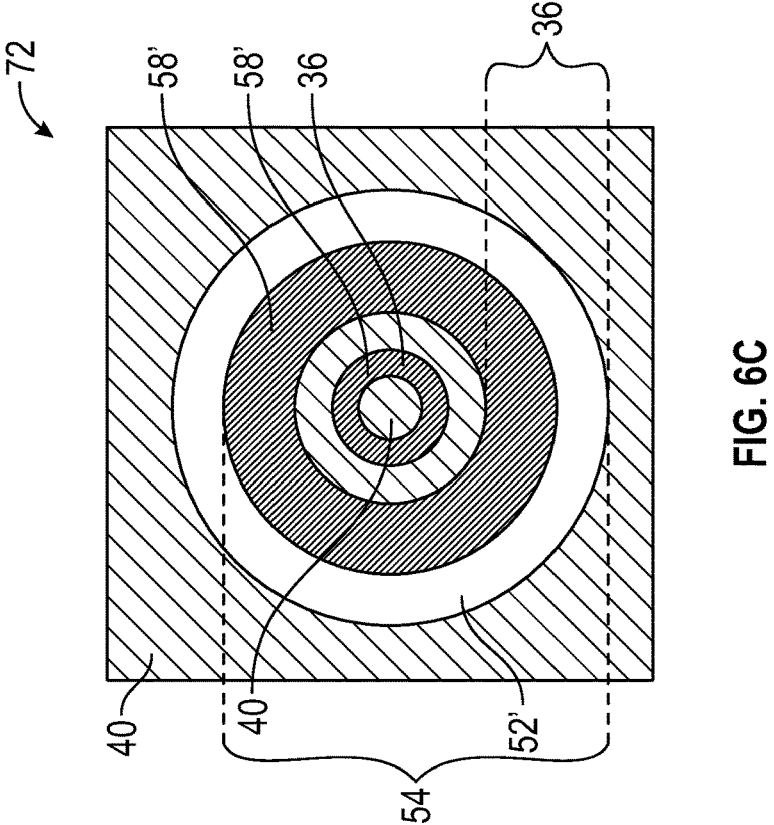
FIG. 6C is a view of a portion of an LED chip that is similar to the LED chip of FIG. 6B for embodiments where the first reflective layer may be provided as a larger circular shape with a larger hollow center and another portion of the first reflective layer is provided within the hollow center.

FIG. 6A is a view of a portion of an LED chip 68 that is similar to FIG. 3B with an alternative arrangement of the portion of the first reflective layer 40 within the opening 54. As illustrated, the first reflective layer 40 may be provided as a circular shape with a hollow center, such as a ring shape. In this regard, the location of the edges 58' of the n-contact interconnect 58 may be formed around the perimeter of the first reflective layer 40 within the opening 54 and also within the hollow portion, thereby providing even further increased edges 58' for current injection. FIG. 6B is a view of a portion of an LED chip 70 that is similar to the LED chip 68 of FIG. 6A for embodiments where the first reflective layer 40 may be provided as a larger circular shape with a larger hollow center. FIG. 6C is a view of a portion of an LED chip 72 that is similar to the LED chip 70 of FIG. 6B for embodiments where the first reflective layer 40 may be provided as a larger circular shape with a larger hollow center and another portion of the first reflective layer 40 is provided within the hollow center. In this manner, the first reflective layer 40 within the opening 54 forms a concentric structure of discontinuous regions. As such, even further increased edges 58' are formed. FIG. 6D is a view of a portion of an LED chip 74 that is similar to the LED chip 72 of FIG. 6C for embodiments where the first reflective layer 40 may be provided as a larger circular shape with a larger hollow center and another portion of the first reflective layer 40 is provided with a smaller diameter within the hollow center.

Each of the embodiments of FIGS. 6A to 6D illustrates exemplary patterns of the first reflective layer 40 and edges 58' of the n-contact interconnect 58 that may be provided. Other patterns are contemplated where one or more discontinuous regions of the first reflective layer 40 are formed within the opening 54 for providing increased surface area of the edges 58' for increased current injection. Additionally, each of the discontinuous regions of the first reflective layer 40 as illustrated in FIGS. 6A to 6D may also be provided within the openings 66 for the reflective layer interconnects 44 as illustrated in FIGS. 5A and 5B.

Figure 7A:
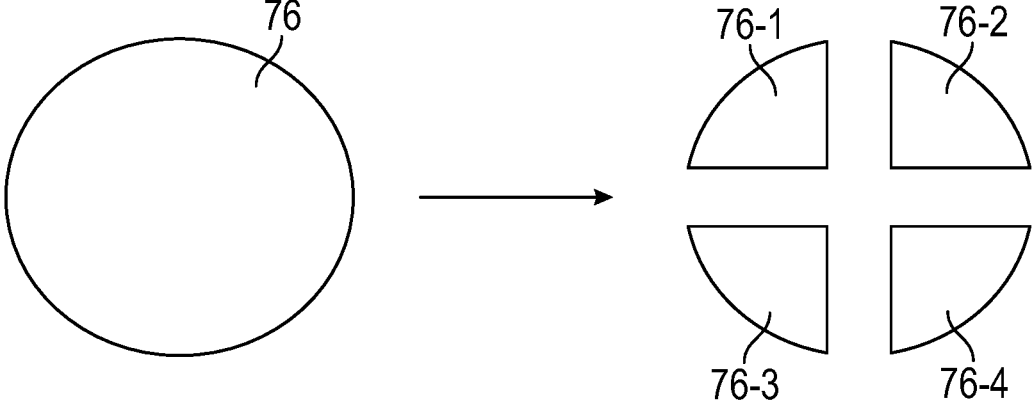
FIG. 7A is an illustration of a circular interconnect that may be subdivided into four pie-shaped interconnect regions within a same chip area.
Figure 7B:
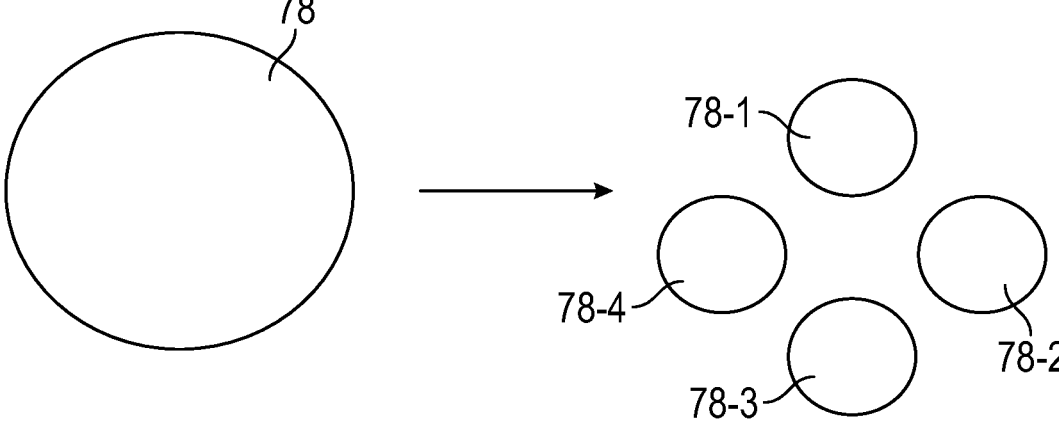
FIG. 7B is an illustration of a circular interconnect that may be subdivided into four circular interconnect regions within a same chip area.
Figure 7C:
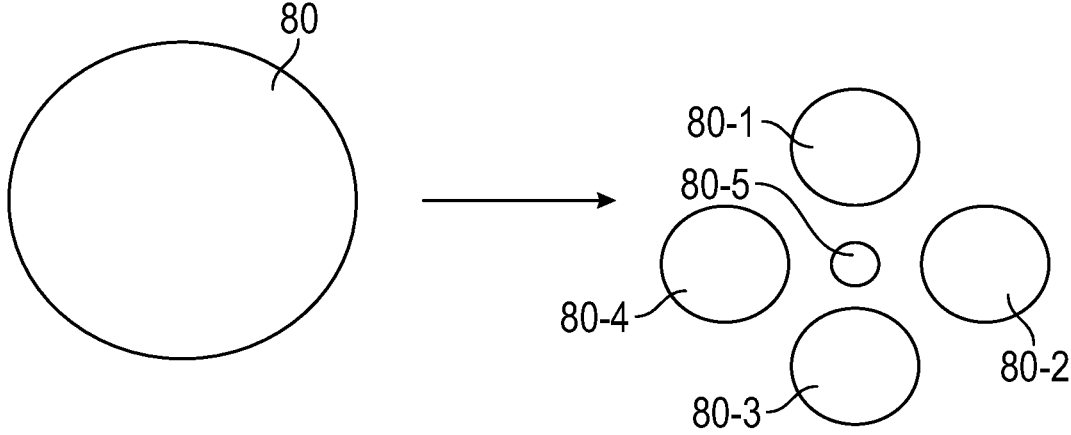
FIG. 7C is an illustration of a circular interconnect that may be subdivided into five circular interconnect regions within a same chip area.

FIGS. 7A to 7B illustrate even further patterns of interconnect structures for providing increased edges for current injection. The interconnect structures of FIGS. 7A to 7B may embody either n-contact interconnects or reflective layer interconnects as described above. In each of FIGS. 7A to 7D, illustrations are provided for an interconnect in an undivided arrangement (left illustration) and a divided arrangement (right illustration) into multiple regions within a same surface area. In this regard, the undivided arrangements may embody portions of the interconnects that are spaced away from the intended contact surface (e.g., the n-type layer or the current spreading layer) and the divided arrangements may embody the edge portions of the interconnect formed at the contact surface. In other embodiments, the divided arrangements may embody entire discontinuous segments that may replace a location of the undivided arrangement. FIG. 7A is an illustration of a circular interconnect 76 that may be subdivided into four pie-shaped interconnect regions 76-1 to 76-4 within a same chip area. FIG. 7B is an illustration of a circular interconnect 78 that may be subdivided into four circular interconnect regions 78-1 to 78-4 within a same chip area. FIG. 7C is an illustration of a circular interconnect 80 that may be subdivided into five circular interconnect regions 80-1 to 80-4 within a same chip area. In this manner, the principles of the present disclosure may provide many different patterns and/or shapes of interconnects that provide enhanced current injection. Current spreading characteristics of different types of LED chips may vary. As such, the particular patterns and/or shapes may be selected based on current spreading characteristics particular to LED chip type.

Figure 8:
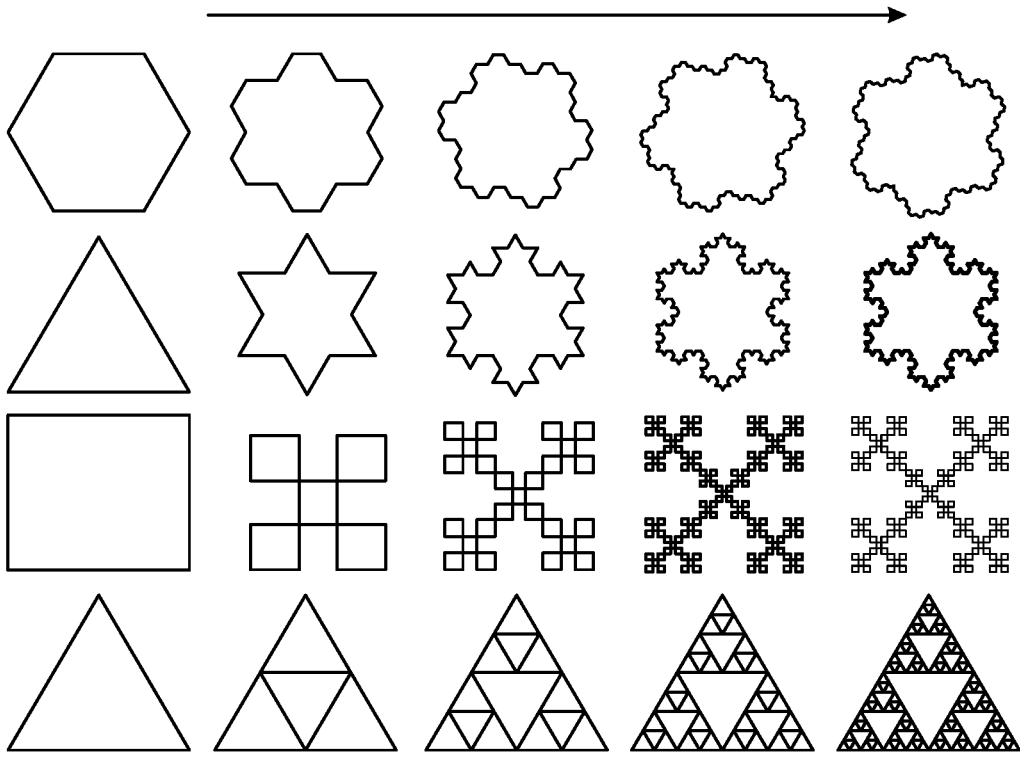
FIG. 8 illustrates interconnect structures formed as any number of fractal shapes for increasing perimeter edges thereof.

FIG. 8 illustrates how the principles of the present disclosure are applicable to any fractal shapes of an interconnect for increasing perimeter edges thereof. In FIG. 8, a column of undivided shapes is provided on the left and a series of corresponding fractal shapes are provided as rows from each of the undivided shapes. As illustrated, each fractal shape from left to right is formed within increasing surface area of perimeter edges, thereby providing even further enhanced current injection. In certain examples, the shape and geometry of various structures are modified into repeated fractural structures, such as repeated squares or triangles of smaller sizes. As illustrated in FIG. 8, the principles of the present disclosure are applicable to many different types of shapes, each of which may be provided by patterned masking of dielectric materials, such as the first reflective layer as previously described, within openings for the interconnects.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) chip, comprising:

an active LED structure comprising an n-type layer, a p-type layer, and an active layer arranged between the n-type layer and the p-type layer, the active LED structure forming a first opening that extends through the p-type layer, the active layer, and a portion of the n-type layer;

a dielectric material on a portion of the n-type layer within the first opening;

an n-contact interconnect that is electrically connected to the n-type layer within the first opening, the n-contact interconnect forming one or more edges that extend from the n-contact interconnect to electrically contact the n-type layer around a perimeter of the dielectric material;

a reflective structure on the p-type layer, wherein the reflective structure comprises a dielectric layer and a metal layer; and a reflective layer interconnect that extends through a second opening of the dielectric layer;

wherein a portion of the dielectric layer is arranged within the second opening and the reflective layer interconnect forms one or more edges that extend from the reflective layer interconnect to form an electrically conductive path to the p-type layer around a perimeter of a portion of the dielectric layer.

2. The LED chip of claim 1, wherein the dielectric material on the portion of the n-type layer within the first opening comprises a same material as the dielectric layer of the reflective structure.

3. The LED chip of claim 1, further comprising an adhesion layer between the dielectric layer and the p-type layer, wherein a portion of the adhesion layer and the dielectric layer covers sidewalls of the p-type layer, the active layer, and the n-type layer within the first opening.

4. The LED chip of claim 3, further comprising a passivation layer within the first opening in a position that is between the n-contact interconnect and the dielectric layer of the reflective structure.

5. The LED chip of claim 4, further comprising an n-contact metal layer that laterally extends across the active LED structure, wherein the n-contact metal layer is electrically coupled to the n-contact interconnect, and the passivation layer is further arranged between the n-contact metal layer and the metal layer of the reflective structure.

6. The LED chip of claim 1, wherein the n-contact interconnect electrically contacts the n-type layer around an entire perimeter of the dielectric material.

7. The LED chip of claim 1, wherein the dielectric material is provided at a center of the first opening, and the n-contact interconnect radially contacts the n-type layer around the perimeter of the dielectric material within the first opening.

8. The LED chip of claim 1, wherein the dielectric material forms a circular shape with a hollow center within the first opening, and the n-contact interconnect radially contacts the n-type layer around the perimeter of the dielectric material and within the hollow center of the dielectric material.

9. The LED chip of claim 1, wherein:

a first portion of the dielectric material forms a circular shape with a hollow center within the first opening;

a second portion of the dielectric material is provided within the hollow center;

the n-contact interconnect contacts the n-type layer around a perimeter of the first portion of the dielectric material; and the n-contact interconnect contacts the n-type layer within the hollow center and between the first portion of the dielectric material and the second portion of the dielectric material.

10. The LED chip of claim 1, wherein the one or more edges of the n-contact interconnect form a plurality of separated portions of the n-contact interconnect.

11. A light-emitting diode (LED) chip, comprising:

an active LED structure comprising an n-type layer, a p-type layer, and an active layer arranged between the n-type layer and the p-type layer, the active LED structure forming a first opening that extends through the p-type layer, the active layer, and a portion of the n-type layer;

an n-contact interconnect that is electrically connected to the n-type layer within the first opening;

a reflective structure on the p-type layer, the reflective structure comprising a dielectric layer, a metal layer, and a first dielectric layer opening that is formed through the dielectric layer; and a first reflective layer interconnect that extends through the first dielectric layer opening, the first reflective layer interconnect forming a first ring that forms a first electrically conductive path to the p-type layer around a perimeter of the n-contact interconnect.

12. The LED chip of claim 11, further comprising a second dielectric layer opening through the dielectric layer of the reflective structure, and a second reflective layer interconnect that extends through the second dielectric layer opening, the second reflective layer interconnect forming a second ring that forms a second electrically conductive path to the p-type layer around a perimeter of the first ring.

13. The LED chip of claim 11, wherein a portion of the dielectric layer of the reflective structure is on a portion of the n-type layer within the first opening, and the n-contact interconnect electrically contacts the n-type layer around a perimeter of the dielectric layer within the first opening.

14. The LED chip of claim 11, wherein:

the n-contact interconnect is one of a plurality of n-contact interconnects electrically coupled to the n-type layer across the active LED structure; and the first ring is one of a plurality of rings electrically coupled to the p-type layer such that a perimeter of each n-contact interconnect of the plurality of n-contact interconnects is surrounded by at least one ring of the plurality of rings.

15. The LED chip of claim 14, further comprising additional reflective layer interconnects that extend through the first dielectric layer opening to form an array pattern of vias that are electrically coupled with the p-type layer between adjacent rings of the plurality of rings.

16. The LED chip of claim 15, wherein diameters of the additional reflective layer interconnects decrease with increasing distance from each of the plurality of n-contact interconnects.

17. A light-emitting diode (LED) chip, comprising:

an active LED structure comprising an n-type layer, a p-type layer, and an active layer arranged between the n-type layer and the p-type layer;

a reflective structure on the p-type layer, the reflective structure comprising a dielectric layer, a metal layer, and a first dielectric layer opening that is formed through the dielectric layer; and a first reflective layer interconnect that extends through the first dielectric layer opening, the first reflective layer interconnect forming an electrically conductive path to the p-type layer around a perimeter of the active LED structure.

18. The LED chip of claim 17, further comprising:

a plurality of n-contact interconnects electrically connected to the n-type layer through a plurality of openings of the active LED structure, the plurality of openings extending through the p-type layer and the active layer;

wherein the first reflective layer interconnect extends around a perimeter of the active LED structure to laterally surround the plurality of n-contact interconnects.

19. The LED chip of claim of claim 17, further comprising:

a plurality of second reflective layer interconnects that extend through a plurality of second dielectric layer openings formed through the dielectric layer of the reflective structure;

wherein the first reflective layer interconnect extends around a perimeter of the active LED structure to laterally surround the plurality of second reflective layer interconnects.

20. The LED chip of claim 19, further comprising:

a plurality of n-contact interconnects electrically connected to the n-type layer through a plurality of openings of the active LED structure, the plurality of openings extending through the p-type layer and the active layer;

wherein certain ones of the plurality of second reflective layer interconnects form rings around certain ones of the plurality of n-contact interconnects; and wherein other ones of the plurality of second reflective layer interconnects form an array pattern of vias.

21. A light-emitting diode (LED) chip, comprising:

an active LED structure comprising an n-type layer, a p-type layer, and an active layer arranged between the n-type layer and the p-type layer;

a reflective structure on the p-type layer, the reflective structure comprising a dielectric layer, a metal layer, and a dielectric layer opening that is formed through the dielectric layer, a first portion of the dielectric layer being arranged within the dielectric layer opening; and a reflective layer interconnect that extends from the metal layer and through the dielectric layer opening, the reflective layer interconnect forming one or more edges that extend from the reflective layer interconnect to form an electrically conductive path to the p-type layer around a perimeter of the first portion of the dielectric layer within the dielectric layer opening.

22. The LED chip of claim 21, wherein the first portion of the dielectric layer is provided at a center of the dielectric layer opening, and the reflective layer interconnect is radially coupled to the p-type layer around the perimeter of the portion of the dielectric layer within the dielectric layer opening.

23. The LED chip of claim 21, further comprising:

an n-contact interconnect electrically connected to the n-type layer through an opening of the active LED structure, the opening extending through the p-type layer and the active layer;

wherein a second portion of the dielectric layer of the reflective structure is on the n-type layer within the opening of the active LED structure, and the n-contact interconnect electrically contacts the n-type layer around a perimeter of the second portion of the dielectric layer within the opening.

24. The LED chip of claim 21, wherein the first portion of the dielectric layer is provided at a center of the dielectric layer opening, and the electrically conductive path is arranged in a radial manner around the perimeter of the first portion of the dielectric layer within the dielectric layer opening.

25. The LED chip of claim 21, wherein:

the first portion of the dielectric layer forms a circular shape with a hollow center within the dielectric layer opening;

the electrically conductive path is arranged in a radial manner around the perimeter of the first portion of the dielectric layer; and the reflective layer interconnect forms another electrically conductive path to the p-type layer within the hollow center.

26. The LED chip of claim 21, wherein:

the first portion of the dielectric layer forms a circular shape with a hollow center within the dielectric layer opening;

a second portion of the dielectric layer is provided within the hollow center;

the electrically conductive path is arranged around a perimeter of the first portion of the dielectric layer; and the reflective layer interconnect forms another electrically conductive path to the p-type layer within the hollow center and between the first portion of the dielectric layer and the second portion of the dielectric layer.

* * * * *